United States Patent
Zupanc et al.

(10) Patent No.: US 11,175,713 B2
(45) Date of Patent: Nov. 16, 2021

(54) FAULT TOLERANCE FOR POWER LOSS IMMINENT CIRCUITRY FAILURE

(71) Applicant: Intel Corporation, Santa Clara, CA (US)

(72) Inventors: Zeljko Zupanc, Vancouver (CA); Andrew Morning-Smith, Vancouver (CA); Mary Goodman, Sacramento, CA (US); Alice Allen, Longmont, CO (US); Simon Ramage, Vancouver (CA); Justin Elkow, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 416 days.

(21) Appl. No.: 16/047,358

(22) Filed: Jul. 27, 2018

(65) Prior Publication Data

US 2019/0041938 A1 Feb. 7, 2019

(51) Int. Cl.
*G06F 1/30* (2006.01)
*H02J 7/00* (2006.01)
*G01R 31/392* (2019.01)
*H02J 7/34* (2006.01)
*G01R 31/40* (2020.01)

(52) U.S. Cl.
CPC .............. *G06F 1/30* (2013.01); *G01R 31/392* (2019.01); *G01R 31/40* (2013.01); *H02J 7/0029* (2013.01); *H02J 7/0068* (2013.01); *H02J 7/00304* (2020.01); *H02J 7/345* (2013.01)

(58) Field of Classification Search
CPC ...... G01R 31/392; G01R 31/40; G01R 31/42; H02J 7/0029; H02J 7/0068; H02J 7/00304; H02J 7/345; G06F 1/30; G06F 1/305
See application file for complete search history.

(56) References Cited

U.S. PATENT DOCUMENTS

| | | | |
|---|---|---|---|
| 8,067,856 B2 * | 11/2011 | Carter | G06F 1/26 307/66 |
| 9,508,399 B1 * | 11/2016 | Bottemiller | G11C 5/141 |
| 2008/0203991 A1 | 8/2008 | Williams | |
| 2018/0032390 A1 * | 2/2018 | Rahmanian | G06F 1/30 |
| 2018/0175732 A1 | 6/2018 | Dai et al. | |
| 2018/0294723 A1 | 10/2018 | Dalena et al. | |

* cited by examiner

*Primary Examiner* — Patrick C Chen
(74) *Attorney, Agent, or Firm* — Compass IP Law PC

(57) ABSTRACT

A nonvolatile storage device includes a power management system with a power loss imminent (PLI) capacitor to provide backup energy in case system power is lost. The power management system includes a circuit with a charging path for the PLI capacitor that includes a series current-limiting circuit, and a diode coupled in parallel with the current-limiting circuit, the diode having a cathode coupled to the charging circuit and an anode to couple to the PLI capacitor.

20 Claims, 11 Drawing Sheets

FAULT TOLERANCE FOR POWER LOSS IMMINENT CIRCUITRY FAILURE

FIELD

Descriptions are generally related to system power, and more particular descriptions are related to monitoring a power loss imminent circuit capacitor.

BACKGROUND

The use of buffering can manage the burstiness of write data that can arrive faster than the storage media is able to store the data. When used with nonvolatile storage, such as in a solid state drive (SSD), buffering can result in data loss if there is an interruption of power in the time between writing of the data to the buffer, and flushing the data from the buffer to the storage media. To address the potential loss of data, some storage systems include a power loss imminent (PLI) circuit. The PLI circuit includes a capacitor with sufficient energy to provide power for a controlled shutdown on power loss. A controlled shutdown allows for in-flight data to be saved and for voltage rails to be ramped down in an orderly sequence, avoiding data corruption or damage to the storage media.

There is a tradeoff with PLI circuits as device sizes decrease. To provide enough energy for a smooth shutdown process, PLI capacitors traditionally had large physical size. As systems decrease in size, larger capacitors are inconsistent with the overall system. Thus, there is a move to higher energy density capacitors for PLI systems. However, many higher energy density capacitors are based on technologies with reliabilities that are lower than that of traditional capacitors. The lower reliability capacitors can suffer failures that are separate from the power loss failures they are intended to guard against. When a capacitor fails "open" or fails in a way to create an open circuit, the PLI protection may be lost, but there is low risk to the rest of the system. However, when a capacitor fails "short" or fails in a way to create a short circuit, the failure can cause a large current spike in a system board (such as a computer motherboard, or cause burnout of SSD components, or cause hard failure of an SSD and thus a hard failure of a computer system.

Thus, the PLI circuit intended to provide protection against power loss in the system can introduce another failure vector into the system. The PLI circuit failure can prevent the ability to commit buffered writes to the storage media, and can randomly cause other system failures including catastrophic system failure.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Descriptions of certain details and implementations follow, including non-limiting descriptions of the figures, which may depict some or all examples, and well as other potential implementations.

DETAILED DESCRIPTION

As described herein, a nonvolatile (NV) storage device includes a power management system with a power loss imminent (PLI) capacitor to provide backup energy in case system power is lost. The NV storage device can include or be a solid state drive (SSD). The power management system includes a circuit with a charging path for the PLI capacitor that includes a series current-limiting circuit, such as a current-limiting resistor, and a diode coupled in parallel with the current-limiter, the diode having a cathode coupled to the charging circuit and an anode to couple to the PLI capacitor. The parallel paths refer to shared boost and buck circuits. The use of the parallel boost and buck paths as described would not typically apply to system that have a boost regulator that is separate from the buck regulator. A "buck-boost" circuit as used herein refers to a circuit that implements a bidirectional buck-boost converter or other regulator with an uncontrolled current path from the input to the PLI capacitor, such as a body diode.

The PLI circuitry and power management provided can prevent system failure if a PLI capacitor fails in a short circuit condition. Even if the PLI capacitor fails, the current limiting resistor can reduce or prevent large current spikes that could otherwise cause damage to the system. The circuitry can limit current excess, protecting the NV storage device and the system components. As described herein, the circuitry can result in a shutdown of the PLI circuitry without causing failure of the system. In one example, the system can detect PLI capacitor failure and generate a notification of the failure. In one example, the notification triggers a remedial operation to prepare the system for maintenance, while still maintaining operation.

The circuitry can be considered detection circuitry to detect PLI capacitor failure. The circuitry can be considered fusing circuitry to provide a fusing function that removes the PLI capacitor from the system. In one example, if the PLI capacitor fails, the system can isolate the capacitor circuit and trigger an alert. Isolating a failed capacitor can enable the rest of the system to continue to operate until the storage device can be repaired or replaced.

Figure 1:
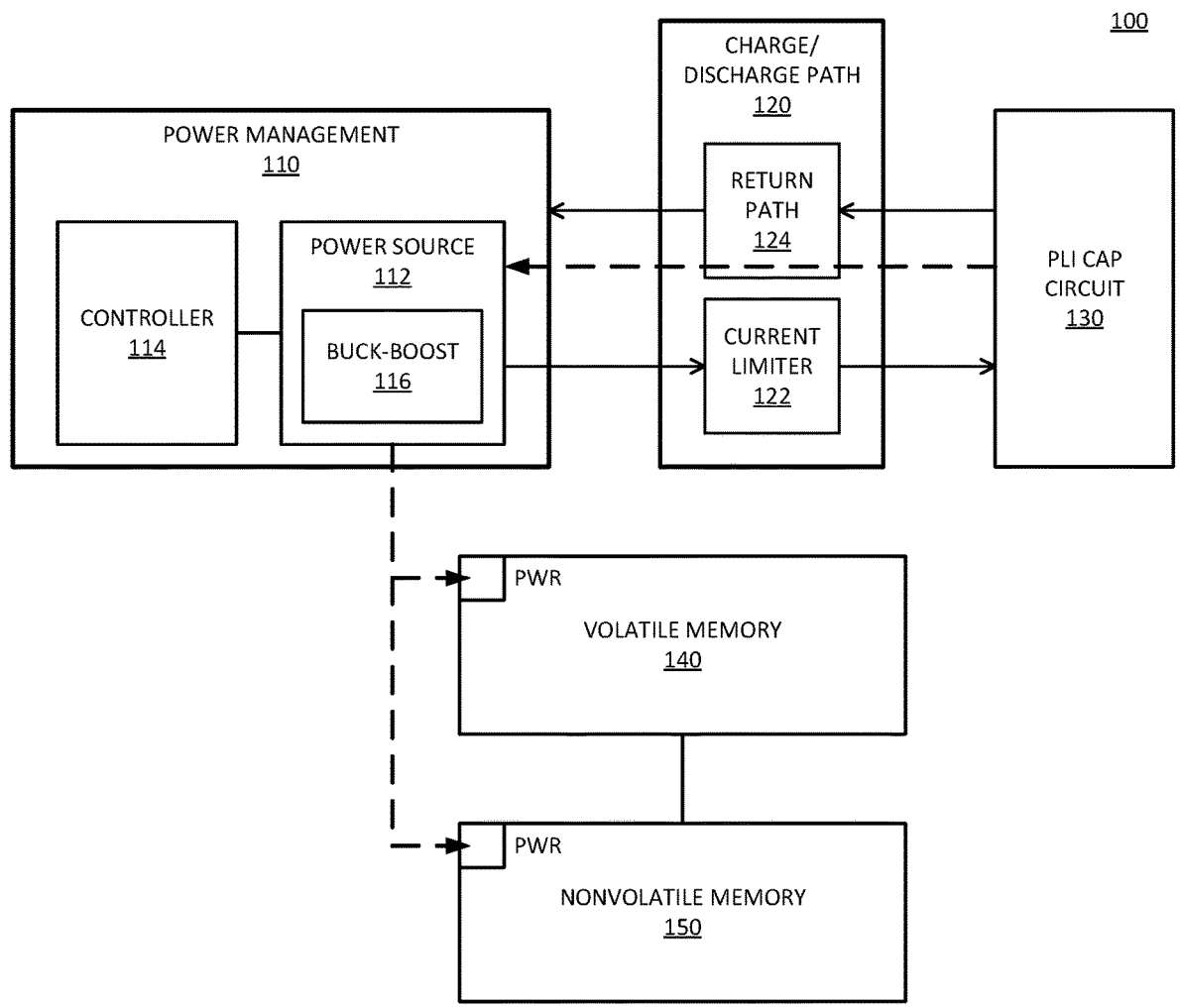
FIG. 1 is a block diagram of an example of a system with a power loss imminent (PLI) circuit and a circuit to monitor the PLI circuit.

FIG. 1 is a block diagram of an example of a system with a power loss imminent (PLI) circuit and a circuit to monitor the PLI circuit. System 100 includes components of a nonvolatile storage system. System 100 includes power management 110 to provide and manage power to system 100. System 100 includes volatile memory 140 to buffer data for nonvolatile memory 150. Volatile memory refers to memory whose state is indeterminate if power is interrupted to the memory; nonvolatile memory refers to memory that maintains state even if power is interrupted to the memory.

Power management 110 represents a power management system. Power management can generally refer to the distribution and control of power delivery in a system. From one perspective, power management 110 can be considered to include power source 112. Power management 110 includes controller 114. Power source 112 represents a primary source of power or power converter for components in system 100. Controller 114 represents control logic to manage the delivery of power from power source 112. Controller 114 controls the operation of power source 112.

In one example, power source 112 includes buck-boost converter or buck-boost circuit 116. Buck-boost 116 represents a bidirectional buck-boost converter or buck-boost circuit. Buck-boost 116 represents a switching regulator that provides a boosted voltage or a lowered voltage for a load. As a bidirectional circuit, buck-boost can provide boost and buck operational phases for PLI cap circuit 130 via charge/discharge path 120.

System 100 includes PLI cap circuit 130, which represents a backup power source in case power source 112 fails. The energy provided by a capacitor of PLI cap circuit 130 can enable volatile memory 140 to flush its contents to the nonvolatile storage medium of nonvolatile memory 150 in the event of an interruption of power from power source 112. The dashed lines represent the power delivery paths from power source 112 to volatile memory 140 and nonvolatile memory 150. In the event of interruption of power from power source 112, PLI cap circuit 130 can provide power to volatile memory 140 and nonvolatile memory 150. Typically the power delivery path from PLI cap circuit 130 will be through power source 112, via return path 124. The power delivery path can be the same return path for dissipation of energy.

System 100 includes charge/discharge path 120. Charge/discharge path 120 provides a path between power source 112 and PLI cap circuit 130. PLI cap circuit 130 includes one or more capacitor elements to store backup energy for system 100. Charge/discharge path 120 can provide a charging path to PLI cap circuit 130 for a boost operation, and a discharge path from PLI cap circuit 130 for a buck operation. In one example, charge/discharge path 120 includes current limiter 122. Current limiter 122 represents one or more circuit elements that limit the current flow in the event that PLI cap circuit 130 fails in a short circuit. For example, current limiter 122 can be or include one or more resistor elements. Other impedance elements such as inductive or switching elements, or a combination, can be or be included in current limiter 122.

In one example, charge/discharge path 120 includes return path 124. Return path 124 can provide a shunt path for PLI cap circuit 130. Return path 124 includes a diode element to control the direction of current flow. Namely, return path 124 provides a one-directional path from PLI cap circuit 130 to power management 110, such as to a dissipation element or a delivery element, for example through power source 112. In one example, the one directional path triggers based on a certain voltage level higher than an expected voltage level to be provided by power source 112. In one example, power management 110 or a circuit of power source 112, or another circuit not specifically shown, includes a power dissipation circuit configured to dissipate power when a threshold voltage is reached at PLI cap circuit 130.

Charge/discharge path 120 can be used to supplement bidirectional buck-boost circuit 116. Charge/discharge path 120 through current limiter 122 provides a path for the boost phase to charge the PLI capacitor of PLI cap circuit 130. Charge/discharge path 120 through return path 124 provides a path for the buck phase. Return path 124 can provide power from the PLI capacitor back to power management 110 in the event of normal PLI shutdown. When return path 124 has minimal impedance, the power can be delivered with minimal current loss to power management 110 during PLI shutdown.

In system 100, the circuitry or hardware of charge/discharge path 120 or the combined hardware of charge/discharge path 120 and power management 110 provides hardware to prevent a failure of system 100 even when PLI cap circuit 130 includes a short failure. In one example, controller 114 provides firmware or software or a combination of firmware and software to manage detection of a failure of PLI cap circuit 130. In one example, charge/discharge path 120 can include buck and boost circuitry to control the power connection of PLI cap circuit 130. In one example, in response to detection of a failure of PLI cap circuit 130, controller 114 sends an alert to a user of system 100. For example, controller 114 can send an alert to an application executing on a host processor (not shown) of a computing system in which system 100 is incorporated. In another example, controller 114 can send an alert to a host operating system (OS) executing on the host processor. An example of the alert can be for controller 114 to generate a flag or change a setting to indicate a need to perform maintenance on the storage system or replace the storage system.

In one example, charge/discharge path 120 includes circuitry to provide detection of failure of PLI cap circuit 130. In one example, controller 114 includes firmware to combine with the hardware of charge/discharge path 120, and can protect against damage to the storage device and the host in the event of a PLI capacitor short. In one example, controller 114 can respond to a crippled state where the PLI capacitor is shorted, and alert the host of the crippled state.

Figure 2:
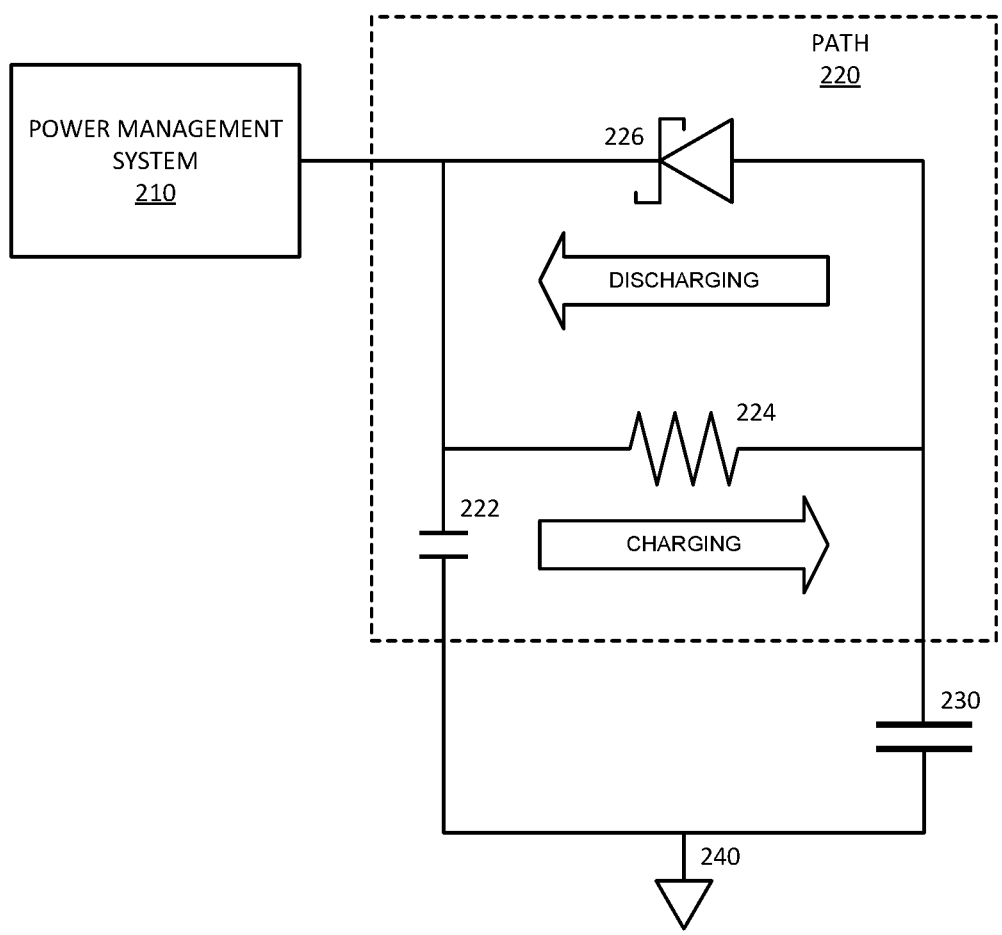
FIG. 2 is a block diagram of an example of a circuit to protect against a short on the PLI capacitor.

FIG. 2 is a block diagram of an example of a circuit to protect against a short on the PLI capacitor. Circuit 200 provides one example of a circuit in accordance with system 100. Circuit 200 can be or be part of a regulator circuit. It will be understood that circuit 200 provides a simplified diagram of circuit elements. An actual implementation of circuit 200 can include other passive or active components not shown in circuit 200. One or more elements illustrated in circuit 200 may be illustrated as singular elements, which can be implemented by multiple circuit elements. Circuit 200 can be integrated into any system that uses a PLI capacitor circuit. Circuit 200 provides a protection circuit to address potential failure of the PLI capacitor.

Circuit 200 includes power management system 210 to manage the power to PLI capacitor 230. Power management system 210 can be or include a PMIC (power management integrated circuit). The power to PLI capacitor 230 can be used to keep the capacitor charged. The voltage level of PLI capacitor 230 is in reference to ground reference 240. In the event that system power (not specifically shown) is lost, PLI capacitor 230 can provide enough energy to charge the components necessary to allow controlled shutdown of logic devices. For example, PLI capacitor 230 can allow for the transfer of data from a volatile memory logic device to a nonvolatile memory logic device. In place of a single power management system 210, circuit 200 can include multiple devices to implement power management system 210. For example, power management system 210 can include control logic or a controller, as well as one or more sensors. An alternative would be to include a processor and separate sensor devices, for example.

Circuit 200 includes path 220, which represents a charging and current return path to PLI capacitor 230. Path 220 is an electrical path between PLI capacitor 230 and power management 210. In one example, path 220 includes holding capacitor 222 to hold charge for PLI capacitor 230. In the charging direction, path 220 includes impedance element 224, which represents a current-limiting component. In the event of a short of PLI capacitor 230, element 224 would limit the flow of current. Impedance element 224 can be or include a resistor. In the discharging direction, path 220 includes diode 226. Diode 226 prevents current flow from power management system 210 to PLI capacitor 230 in the direction of charging, and supports current flow as a return from PLI capacitor 230 to power management system 210, or a discharge component. In one example, in accordance with the circuit symbol, diode 226 can be a Schottky diode or other hot-carrier diode. A Schottky diode provides a low forward voltage threshold, which reduces the over-voltage condition required at PLI capacitor 230 before current begins to flow. However, another diode could be used, as will be understood by those skilled in the art.

Some switching regulators use a bidirectional buck-boost circuit, which could be part of power management system 210, such as buck-boost circuit 116 of system 100. A traditional buck-boost circuit operates on a switching power signal, to convert from a lower voltage to a higher voltage (charging) or from a higher voltage to a lower voltage (discharging). In one example, circuit 200 includes capacitor 212 as the energy holding element at the output of the buck-boost converter. Power management system 210 can provide a switched current signal to path 220. Alternatively, circuit 200 could include a specific switch element controlled by control logic of power management system 210 or other controller.

In circuit 200, the charging path is used during the "boost" phase, which provides a higher voltage than the original to enable charging the load capacitor (PLI capacitor 230) to a higher voltage than the original supply. While single boost and buck stages are represented in circuit 200, the circuit is not limited to single stages. In one example, a multistage boost path could be used. In one example, a multistage buck path could be used. In one example, a multistage boost path and a multistage buck path can be used.

In one example, impedance element 224 limits current draw from the main input drive rail in the charging path if PLI capacitor 230 shorts. Limiting the current draw can allow continuous operation of the system incorporating circuit 200, such as a nonvolatile memory system or SSD. In one example, diode 226 allows full current to be drawn in the discharging path during normal operation. Circuit 200 provides current limiting capability on a path that has shared boost and buck circuitry. The current limiting only limits and protects the boost functionality for charging PLI capacitor 230 during normal operation, while minimally impacting buck functionality through diode 226 during holdup time. A buck-boost circuit does not traditionally include current limiting on shared paths. A circuit might traditionally limit current on paths that are not shared, but not on shared paths.

In one example, power management system 210 includes hardware sensors or connects to hardware sensors that can provide short detection. In one example, the short detection can be a high current monitor or high current detection circuit. In one example, the short detection can be a low voltage detector or low voltage detection circuit. In one example, power management system 210 provides a capacitor health test for PLI capacitor 230 to only start measurement once the voltage has dropped below a specific threshold to accommodate for the effect of diode 226 on the voltage when discharging.

In one example, circuit 200 provides power control with a charging circuit to charge PLI capacitor 230 as a backup energy store in case system power is lost. Path 220 can be referred to as a charging/discharging path to couple power management system 210 or other charging circuit to PLI capacitor 230. Path 220 includes impedance element 224 as a current limiter for charging and diode 226 for discharging coupled in parallel with the current limiter. Diode 226 is coupled with the cathode coupled to the charging circuit or power management system 210, and the anode to couple to PLI capacitor 230.

Figure 3:
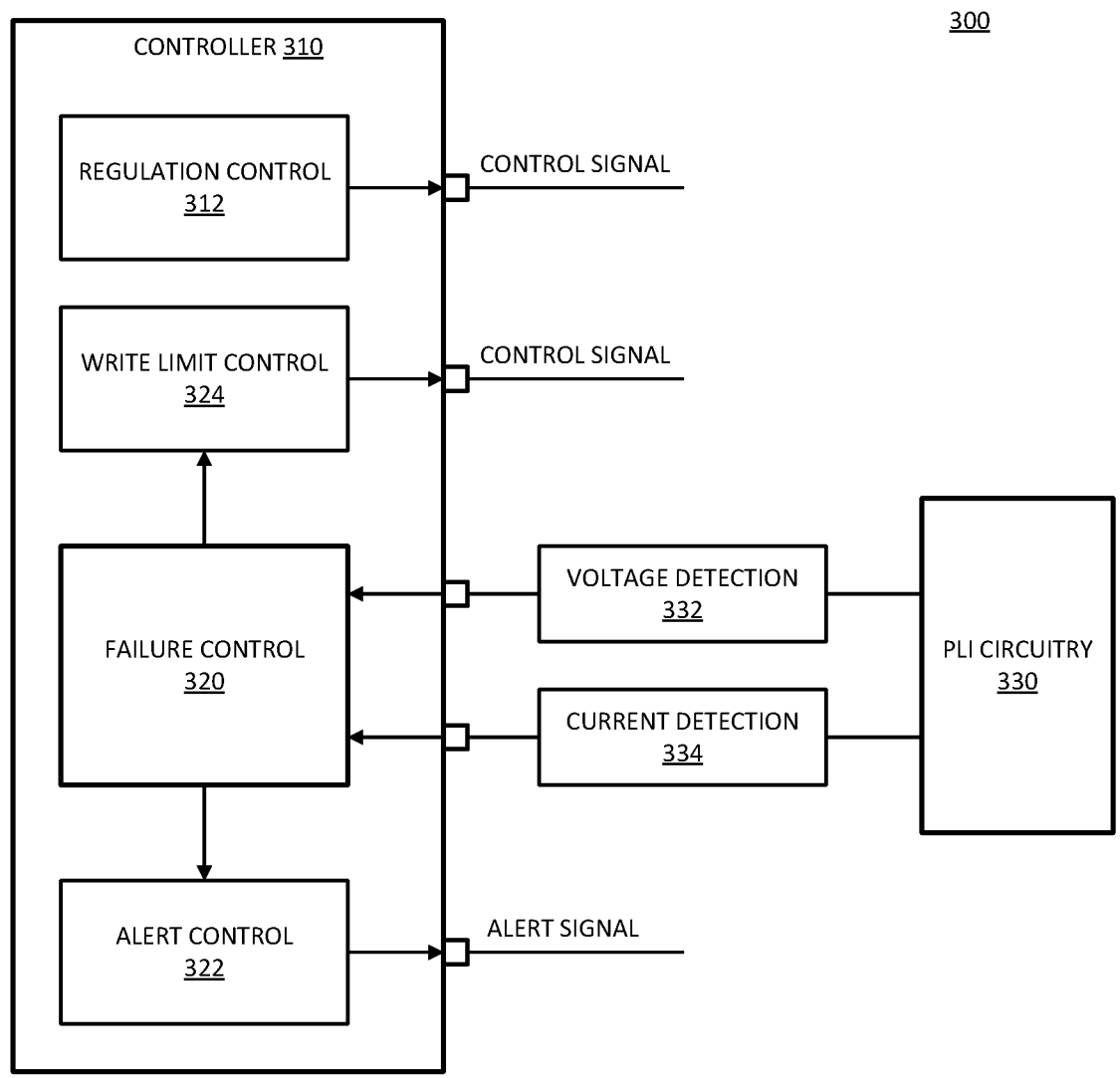
FIG. 3 is a block diagram of an example of a controller to monitor a PLI capacitor.

FIG. 3 is a block diagram of an example of a controller to monitor a PLI capacitor. System 300 represents components of a power management controller. System 300 provides an example of a power management controller in accordance with power management 110 of FIG. 1 or an example of power management system 210 of FIG. 2. System 300 can be a single power management integrated circuit or a single chip, or can be multiple separate chips that work in a single controller system. In one example, system 300 represents control elements that can be located at a nonvolatile memory device and at a host system, such as part of driver circuitry of the host system.

Controller 310 represents control logic to manage the power for PLI circuitry 330. In one example, controller 310 is part of a power management controller that generally controls power distribution for a computing system in which system 300 is incorporated. In one example, controller 310 includes logic elements that are separate from a general power management controller.

In one example, controller 310 includes regulation control 312. Regulation control 312 represents control logic to control the regulation settings of a regulator circuit. The regulator circuit can provide power to charge PLI circuitry 330. It will be understood that a specific charging path between controller 310 and PLI circuitry 330 is not illustrated in system 300, but can be in accordance with what is illustrated in other systems. The control logic of regulation control 312 can, for example, set configuration of regulation circuitry, provide switching control for a switching circuit, or perform other operations to control the output of a regulation circuit. The square can represent a pin or connector to a logic chip of controller 310. Regulation control 312 provides one or more control signals to other components to control the operation of the regulator that charges the PLI capacitor.

Controller 310 includes failure control logic 320. Failure control 320 represents logic to respond to detection of a short of the PLI capacitor. Controller 310 can check PLI circuitry 330 to determine the health or the functioning of the PLI capacitor circuit. In one example, controller 310 checks PLI circuitry 330 through failure control 320. In one example, system 300 includes voltage detection 332, which represents circuitry or control logic to detect a voltage of PLI circuitry 330. Voltage detection 332 determines whether the voltage at the high voltage end of the PLI capacitor is within an expected range. The expected range can be, for example, within a certain tolerance percentage of a desired voltage to charge the capacitor. In one example, a short of the PLI capacitor will have the effect of dropping the voltage to ground, and an under-voltage condition can be identified. In one example, voltage detection 332 is incorporated into a common IC as controller 310.

In one example, system 300 includes current detection 334, which represents circuitry or control logic to detect a current of PLI circuitry 330. Current detection 334 determines whether the current going to the PLI capacitor is within an expected range. The expected range can be, for example, within a certain tolerance percentage of a desired current to charge the capacitor. In one example, a short of the PLI capacitor will have the effect of connecting the circuit to ground, causing the current to increase to a maximum current possible for the regulator. Current detection 334 can detect the increase in current. In one example, current detection 334 is incorporated into a common IC as controller 310.

In one example, system 300 includes voltage detection 332. In one example, system 300 includes current detection 334. System 300 may only need either voltage detection 332 or current detection 334, but not both. However, in one example, system 300 can include both voltage detection 332 and current detection 334. In one example, either or both of voltage detection 332 and current detection 334 can connect to controller 310 through one or more pins or connectors.

Failure control 320 can generally check PLI circuitry 330 in one of two ways, through polling or through interrupt. Checking through polling can be considered proactive checking, as it requires action by controller 310. Checking through interrupt can be considered reactive checking, as it responds to an asynchronous event of the interrupt. In one example, the polling or interrupt checking can occur through a pin connecting to voltage detection 332 or to current detection 334, or both. In an implementation where the detector (either current or voltage) is incorporated into controller 310, the pin can be a connection to a measured point of PLI circuitry 330, and connect internally to the detector. Such a pin would typically be an analog interface. In an implementation where the detector is external to controller 310, the pin can be a connector to the detector itself, and the detector will otherwise be connected to the measurement point of PLI circuitry 330. In such an implementation, the pin can be either digital (if the detector provides a digital output), or analog (if the detector provides an analog output).

In one example, the polling includes failure control 320 proactively reading a pin of controller 310 to measure a voltage or current level, triggering a reading of a detector or sensor, whether within the controller or external to it. In one example, the interrupt includes a detector or sensor generating an interrupt if an out-of-range measurement is detected.

In one example, failure control 320 performs a determination of a state of PLI circuitry 330 based on information from the relevant detector or detectors. The determination of state can include the computation of one or more calculations to process the input data from the detector to determine whether the detector signal indicates a value within an expected range. If the value is within the expected range, the detection can be determined to detect a valid state of the PLI capacitor, or to detect "good health" of PLI circuitry 330. If the value is outside the expected range, failure control 320 can perform a remedial operation based on the failed state of PLI circuitry 330.

In one example, failure control 320 can generate an alert to a host system (not specifically shown). Alert control 322 represents control logic to generate and send the alert. In one example, the sending of the alert includes generating an alert signal on an output pin of controller 310. In one example, the alert is an alert within controller 310 to control firmware or software within controller 320 to change how controller 310 operates. In one example, system 300 is part of an SSD, and the alert signal is a signal based on a self-monitoring, analysis, and reporting technology (SMART) error signal. In one example, the alert signal indicates a detection of a failure of PLI circuitry 330. In one example, alert control 322 can generate more than one alert. An alert indication of failure of PLI circuitry 330 can indicate a lack of PLI protection due to the loss of the PLI capacitor. In one example, system 300 continues to operate with write and read capability but at increased risk of loss due to the lack of PLI circuitry.

In one example, system 300 supports an NV storage device, and failure control 320 can limit the write operation to the NV media based on detection of the failure. In one example, a detected failure causes controller 310 to limit writes to writing directly to the nonvolatile media and bypassing a buffer. For example, write limit control 324 can trigger the system to only allow the use of NV storage without first writing to a volatile buffer. Not using the volatile buffer will impact write performance by significantly increasing write delay; however, bypassing the volatile memory buffer can reduce the risk of loss in the event power is lost and PLI circuitry 330 is unavailable to enable transfer of contents to nonvolatile storage. In another example, write limit control 324 can trigger the system to enter a read-only mode, preventing writes entirely. The use of a read-only mode avoids the write performance impact of bypassing the buffer, but has then requires writes to a different storage device or prevents writes entirely.

In one example, controller 310 performs checking at startup of system 300, and continues to perform checking throughout runtime of the system. In one example, controller 310 waits until runtime and continues to perform checking throughout runtime. In general, startup can be considered to be associated with a BIOS (basic input/output system) or boot firmware, and runtime can be considered to be associated with the main OS (operating system) of the computing device. Thus, either boot firmware or the OS, or both, can trigger controller 310 to operate.

In one example, controller 310 can respond to configuration by a user that sets which failure response will be used. For example, a system can be configured to either continue operation without PLI protection, to limit to read-only, or to limit writes to unbuffered writes. The configuration can be based on operation of the device, such as a workload.

Figure 4A:
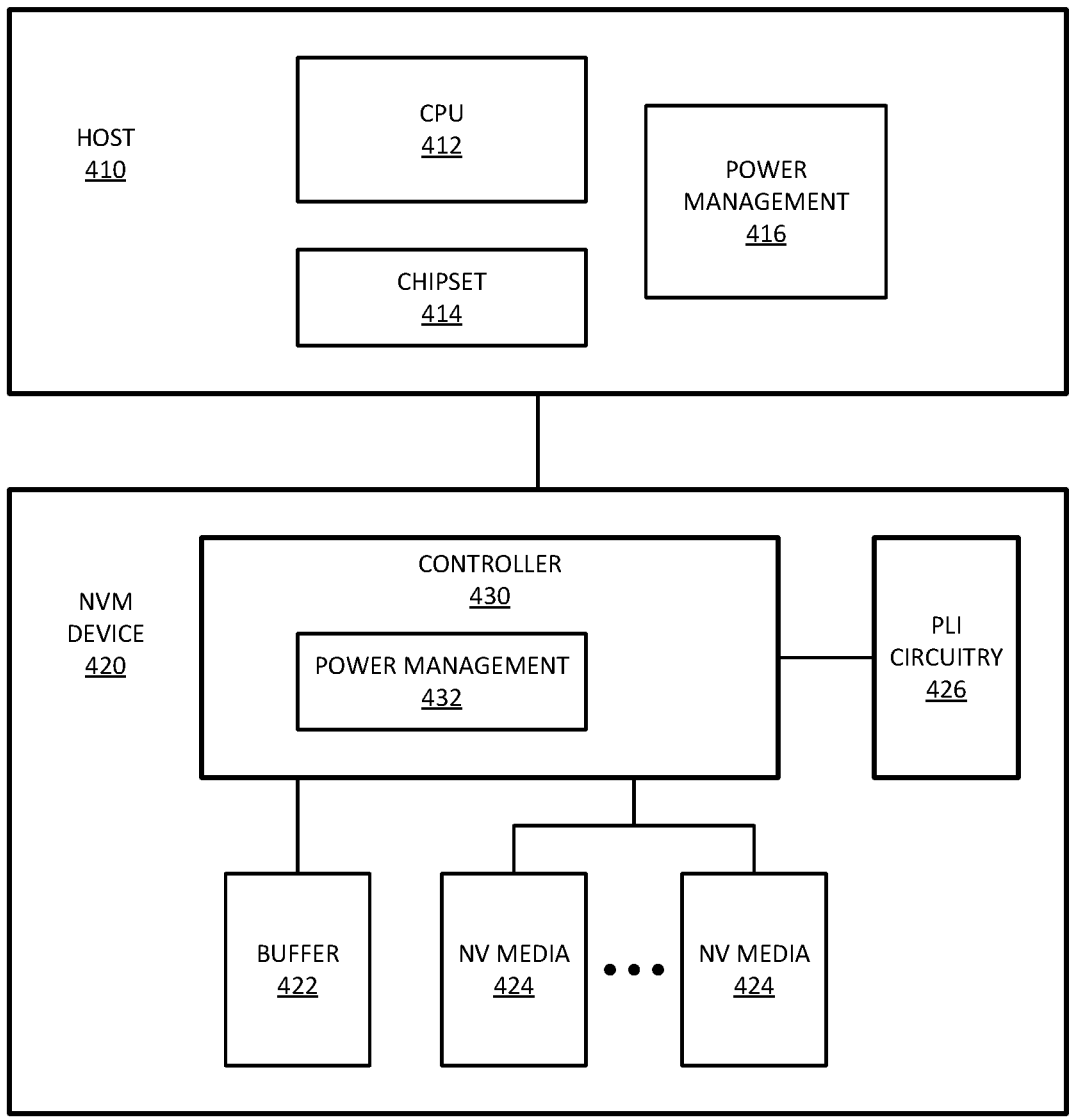
FIG. 4A is a block diagram of an example of a nonvolatile storage system with a PLI circuit and power management to manage the PLI circuit.

FIG. 4A is a block diagram of an example of a nonvolatile storage system with a PLI circuit and power management to manage the PLI circuit. System 402 includes NVM (nonvolatile memory) device 420 coupled with host 410. In one example, NVM device 420 is a solid state drive (SSD). Host 410 represents a host hardware platform that connects to NVM device 420. Host 410 includes CPU (central processing unit) 412 or other processor as a host processor. CPU 412 represents any host processor that generates requests to access data stored on NVM device 420, either to read the data or to write data to the storage. Such a processor can include a single or multicore processor, a primary processor for a computing device, a graphics processor, a peripheral processor, or a supplemental or auxiliary processor, or a combination. CPU 412 can execute a host OS and other applications to cause the operation of system 402.

Host 410 includes chipset 414, which represents hardware components that can be included in connecting between CPU 412 and NVM device 420. For example, chipset 414 can include interconnect circuits and logic to enable access to NVM device 420. Thus, host platform 410 can include a hardware platform drive interconnect to couple NVM device 420 to host 410. Host 410 includes hardware to interconnect to the NVM device. Likewise, NVM device 420 includes corresponding hardware to interconnect to host 410. In one example, chipset 414 includes a storage controller, which is a host-side controller that is separate from controller 430 within NVM device 420.

NVM device 420 represents a storage drive that includes a primary nonvolatile (NV) media to store data, represented by NV media 424. Buffer 422 represents a smaller, faster media to act as a buffer or cache for NV media 424. Typically buffer 422 is a volatile memory media, and PLI circuitry 426 can provide a voltage source to allow transfer of data from buffer 422 to NV media 424. PLI circuitry 426 can be an example of PLI circuitry in accordance with any example herein.

NVM device 420 includes controller 430 to control access to buffer 422 and NV media 424. Controller 430 represents hardware and control logic within NVM device 420 to execute control over the media. In one example, controller 430 includes an interface to buffer 422, and includes an interface to host 410. Controller 430 is specifically illustrated to include power management 432, which represents hardware and control logic to control the power distribution within NVM device 420. Power management 432 provides an example of power management to monitor PLI circuitry 426 in accordance with any example herein.

Power management 416 represents logic within the host that can perform power management functions at the system level, or respond to signals from power management 432. Power management 432 can detect a short of the PLI capacitor of PLI circuitry 426. In response to detection of a failure of PLI circuitry 426, power management 432 can indicate lack of PLI protection for NVM device 420. In addition to an indication of lack of PLI protection, power management 432 can trigger NVM device 420 to enter a remedial state, such as read-only, or unbuffered write. Write limitation can limit write access to NV media 424. In one example, power management 416 can change write scheduling based on receipt of an indication of PLI failure or an indication of a remedial operation state, or both. In one example, power management 416 can change a setting within a storage controller, for example, to comply with write restrictions, or to change timing or delay parameters for write, or both.

Figure 4B:
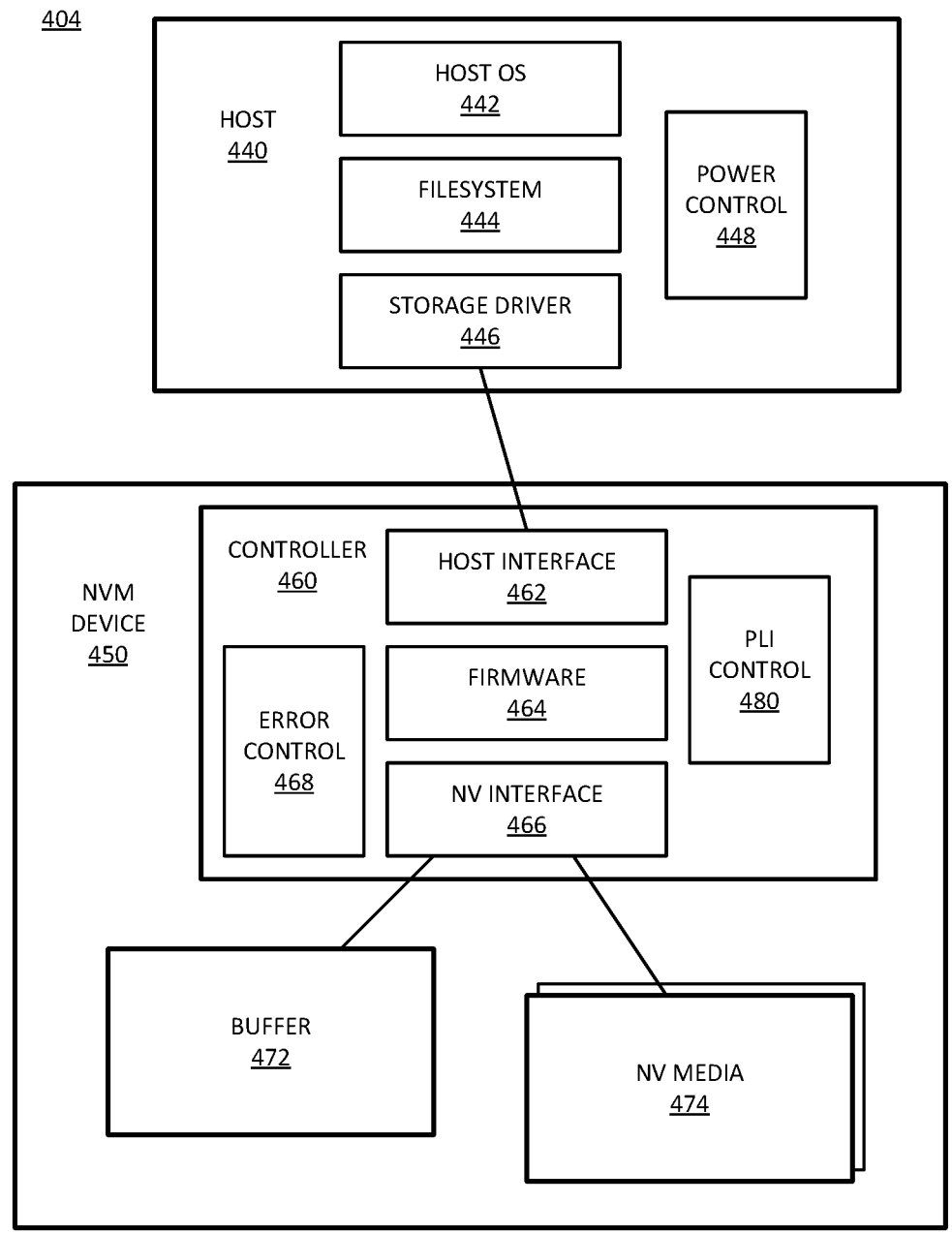
FIG. 4B is a block diagram of an example of a nonvolatile storage system with a PLI circuit and a controller with power control to manage the PLI circuit.

FIG. 4B is a block diagram of an example of a nonvolatile storage system with a PLI circuit and a controller with power control to manage the PLI circuit. System 404 provides one example of a system in accordance with system 402 of FIG. 4A. System 404 illustrates the logical layers of the host and NVM device of a hardware platform in accordance with system 402. System 404 can represent software and firmware components of an example of system 402, as well as physical components. In one example, host 440 provides one example of host 410. In one example, NVM device 450 provides one example of NVM device 420.

In one example, host 440 includes host OS 442, which represents a host operating system or software platform for the host. Host OS 442 can include a platform on which applications, services, agents, and/or other software executes, and is executed by a processor. Filesystem 444 represents control logic for controlling access to the NV media. Filesystem 444 can manage what addresses or memory locations are used to store what data. There are numerous filesystems known, and filesystem 444 can implement known filesystems or other proprietary systems. In one example, filesystem 444 is part of host OS 442.

Storage driver 446 represents one or more system-level modules that control the hardware of host 440. In one example, drivers 446 include a software application to control the interface to NVM device 450, and thus control the hardware of NVM device 450. Storage driver 446 can provide a communication interface between the host and the NVM device.

Controller 460 of NVM device 450 includes firmware 464, which represents control software/firmware for the controller. In one example, controller 460 includes host interface 462, which represents an interface to host 440. In one example, controller 460 includes NV interface 466, which represents an interface to buffer 472 and NV media 474. It will be understood that NV interface 466 can interface with a volatile memory device as a buffer for the NV media. Interfaces 462 and 466 represent control that is executed on hardware of controller 460. It will be understood that controller 460 includes hardware to interface with host 440, which can be considered to be controlled by host interface software/firmware 462. Likewise, it will be understood that controller 460 includes hardware to interface with buffer 472 and NV media 474. In one example, code for host interface 462 can be part of firmware 464. In one example, code for NV interface 466 can be part of firmware 464.

Firmware 464 controls the hardware interfaces to enable communication. In one example, firmware 464 includes a storage controller that performs continuous checkpointing in accordance with what is described above. It will be understood that more hardware implementation within controller 460 will increase the speed of operation of the NVM device. Thus, command sequences can be implemented in firmware (e.g., firmware 464 or NV interface 466), but firmware is generally slower than hardware. Firmware is more flexible because it can perform more operations and be modified, but hardware is generally much faster than firmware implementations. It will be understood that there are aspects of interaction that are handled in firmware in all cases, seeing that the firmware controls the hardware. However, firmware implementation refers to an implementation in which all sequencing and all processing of signals is performed in firmware controlled logic. A hardware implementation includes hardware processing of at least some of the signal exchanges. Firmware control over the hardware needs to be compatible with both the hardware interface of controller 460, as well as the hardware of NV media device 474.

An example of hardware versus firmware can be represented by error control 468. Error control 468 handles data errors in accessed data, and corner cases in terms of compliance with signaling and communication interfacing. It is possible to implement at least some of error control in hardware. However, most error control is implemented in firmware for the flexibility, even if it is slower than a hardware implementation. A hardware implementation may require an impractical amount of hardware logic to implement. Similarly, in one example, firmware 464 handles erase operations and drive cleanup procedures.

NV media 474 represents a nonvolatile storage device. In one example, buffer 472 can reduce the delay associated with a burst of writes. Buffer 472 can be flushed to NV media 474 to commit the data to nonvolatile storage. In the event system power is lost in system 404, a PLI capacitor can enable the committing of data from buffer 472 to NV media 474 to enable a smooth shutdown with very low risk of data loss. PLI control 480 represents control logic within controller 460, or as a separate controller within NVM device 450, to monitor the health of PLI circuitry.

PLI control 480 can monitor the PLI circuitry for failure, and provide control of NVM device 450 in response to detection of a failure of the PLI circuitry, in accordance with any example herein. In one example, host 440 includes power control 448, which can enable the response of the host to a failure of PLI circuitry.

In one example, NVM device 450 can continue to operate without PLI protection if the PLI circuitry fails in a short. In one example, PLI control 480 triggers NVM device 450 to operation in one of multiple modes, a mode where buffer 472 as a write cache continues to operate, or a mode with forced unit access where buffer 472 does not continue to operate, but writes can only be made directly to NV media 474, or a mode where only reads are permitted to NV media 474.

In one example, system 402 and system 404 can be understood to operate in conjunction as a combined hardware and firmware solution to protect against damage to a NVM device and to the host hardware associated with the NVM device in the event of a PLI capacitor short. The combined system can include hardware to detect the occurrence of the event of a PLI capacitor short, and firmware or software to alert the host of the crippled state. The hardware can limit current flowing into the shorted capacitor and to detect the shorted condition. Firmware or software can respond to the crippled state once the capacitor shorts and to alert the host of the condition. The firmware or software can also respond to the condition by limiting operation of the NVM device in the crippled state.

Figure 5:
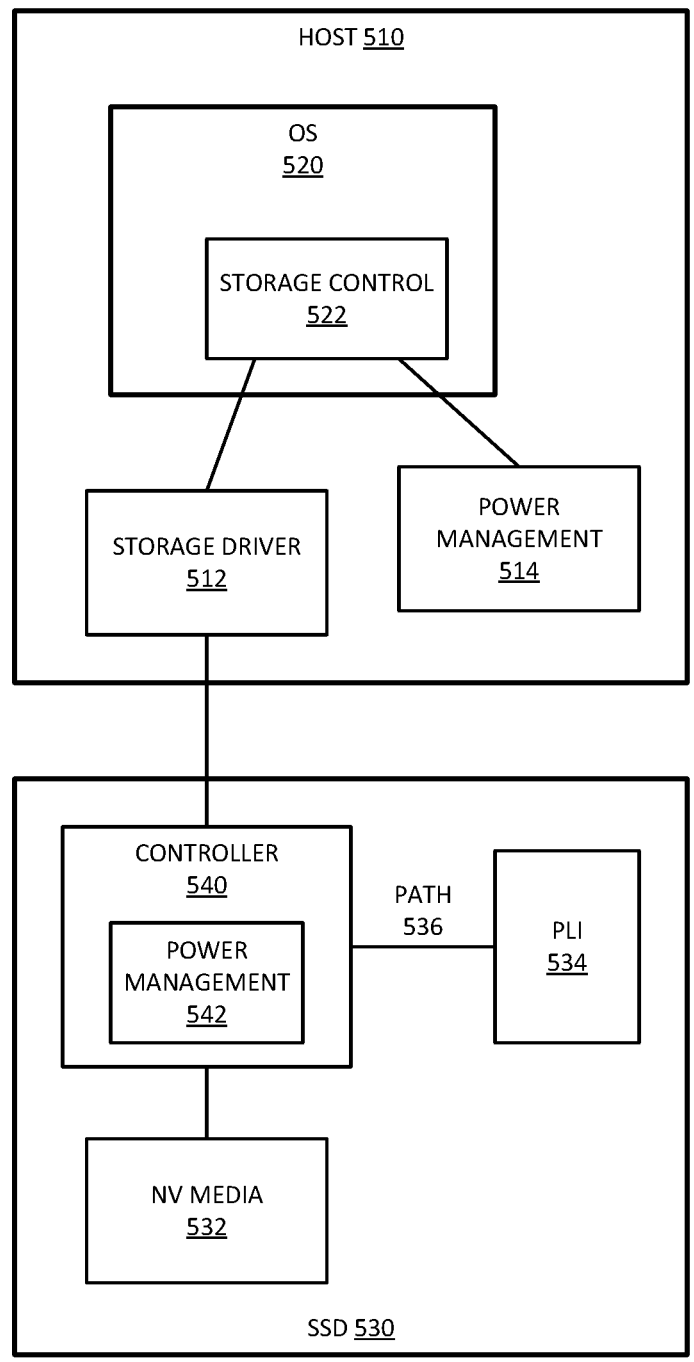
FIG. 5 is a block diagram of an example of a system having a host with power management, and a solid state drive (SSD) with power management to monitor a PLI circuit.

FIG. 5 is a block diagram of an example of a system having a host with power management, and a solid state drive (SSD) with power management to monitor a PLI circuit. System 500 provides an example of a system in accordance with system 402 of FIG. 4A or system 404 of FIG. 4B. System 500 includes host 510 coupled to SSD 530. System 500 illustrates a system in which SSD 530 includes a PLI circuit and a circuit to monitor the PLI circuit.

Host 510 includes a processor to execute OS 520. Software and control programs of host 510 execute under OS 520. In one example, OS 520 includes storage control 522, which represents control logic to manage access to SSD 530. Storage control 522 can control the operation of storage driver 512. For example, storage control 522 can control the timing or operation of write control based on a state of PLI circuit 534 of SSD 530.

Storage driver 512 represents hardware and firmware to interface with SSD 530. In one example, storage driver 512 interfaces with controller 540, which represents a processor, controller, or hardware logic of SSD 530 to manage data access requests and manage access to NV media 532. SSD 530 includes primary storage media and a faster memory media (not specifically shown) that buffers access to the slower primary storage media of NV media 532.

In one example, host 510 includes power management 514, which represents hardware in host 510 to distribute, monitor, and control the power in host 510, as well as in SSD 530. For example, SSD 530 can be powered by power management hardware on the host. Power management 514 can be configured to trigger soft shutdown based on power from PLI 534 in case power system is interrupted. In one example, power management 514 can adjust operation based on an alert from SSD 530 that PLI 534 is in a crippled state.

In one example, controller 540 includes or connects to power management controller 542. Power management 542 monitors PLI 534. In one example, power management 542 controls charging of PLI 534 via path 536 in accordance with any description herein. Path 536 includes a current limiter and a current return path. Power management 542 monitors PLI 534, and can detect a short of the PLI capacitor, and respond to the short. The operation of power management 542 can be in accordance with any description herein.

Figure 6:
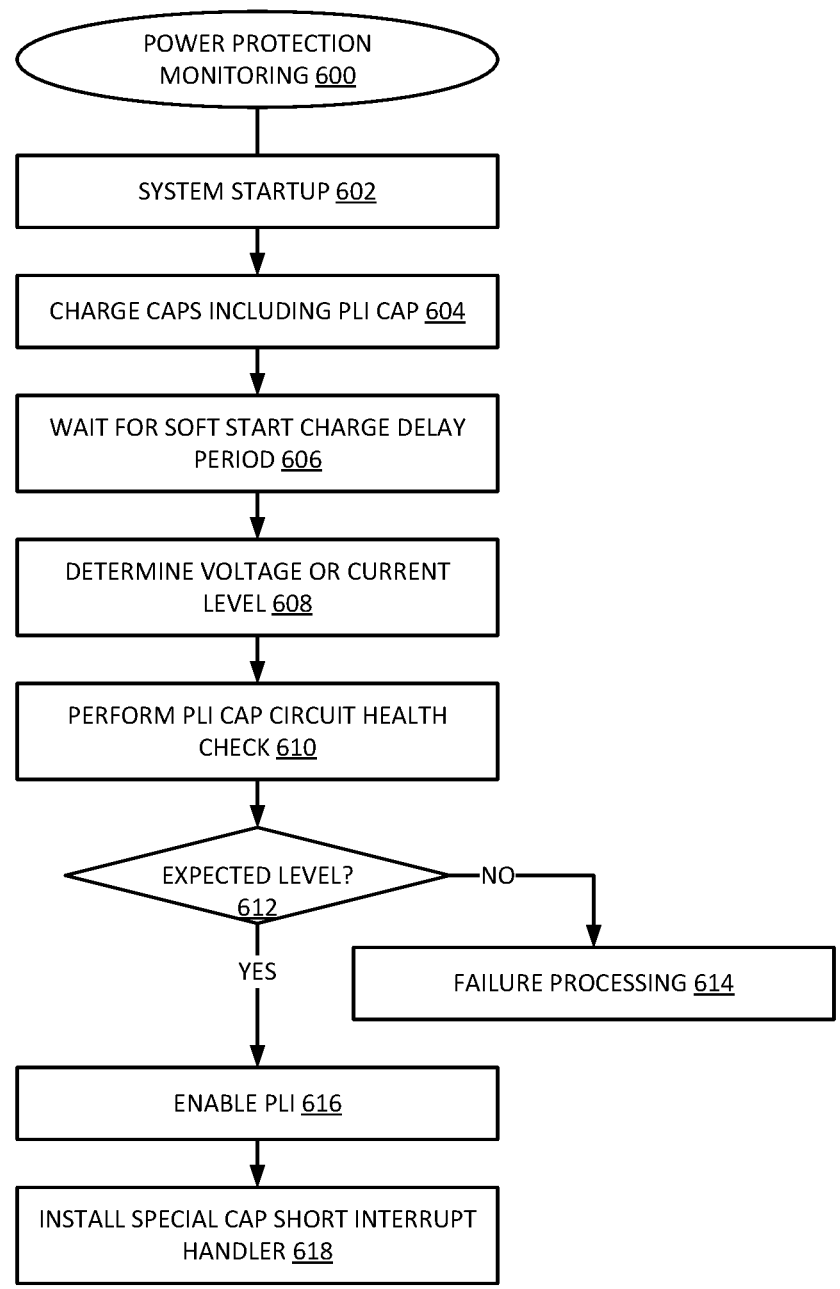
FIG. 6 is a flow diagram of an example of a process for monitoring a power protection circuit.

FIG. 6 is a flow diagram of an example of a process for monitoring a power protection circuit. Process 600 illustrates a process for power protection monitoring. More particularly, process 600 illustrates a process for monitoring a PLI capacitor circuit. Process 600 can be executed by power management that monitors a PLI circuit in accordance with any description herein.

In one example, the power protection monitoring initiates at system startup, 602. In one example, the power protection monitoring initiates at runtime. The system charges the power capacitors, including a PLI capacitor, 604. In one example, the monitoring system, which can include hardware or firmware or a combination, waits for a soft start charge delay period, 606. The delay period enables the capacitors sufficient time to come to full charge if they are working properly.

In one example, the power protection monitoring determines a voltage level of the PLI capacitor through a charging path, 608. In one example, the power protection monitoring determines a current level of the charging path connected to power the PLI capacitor, 608. Based on the voltage level or current level or both, the power protection monitoring can perform PLI capacitor health check, 610. In one example, as an alternative to checking voltage level or current level, or in addition to checking voltage level or current level, or both, the power protection monitoring checks charge time of the PLI capacitor. In another example, as an alternative to other checking or in combination with other checking, the power protection monitoring checks discharge time of the PLI capacitor.

If the measured voltage/current level is not determined to be within an expected level, 612 NO branch, the power protection monitoring can perform failure processing, 614. In an implementation measuring charge or discharge time, the power protection monitoring can determine if the charge or discharge time is within an expected time. If the measured voltage/current level is determined to be with the expected level, 612 YES branch, the PLI capacitor is determined to be operating correctly, and the system enables the PLI protection, 616. In one example, the system installs a special capacitor short interrupt handler, 618, to continue to monitor the health of the PLI protection. In one example, the system continues monitoring with polling instead of interrupts.

In one example, upon detection of a PLI capacitor short, power protection monitoring firmware will shut down the charging circuitry. In one example, upon detection of the PLI capacitor short, the power protection monitoring firmware sends an alert (e.g., a SMART alert) to a customer that computing system (such as a nonvolatile storage drive) needs maintenance, such as needing replacement. In the case of a drive, the drive can still be able to operate without PLI protection. In one example, the drive can be set into one of multiple modes depending on a customer configuration for error handling.

Figure 7:
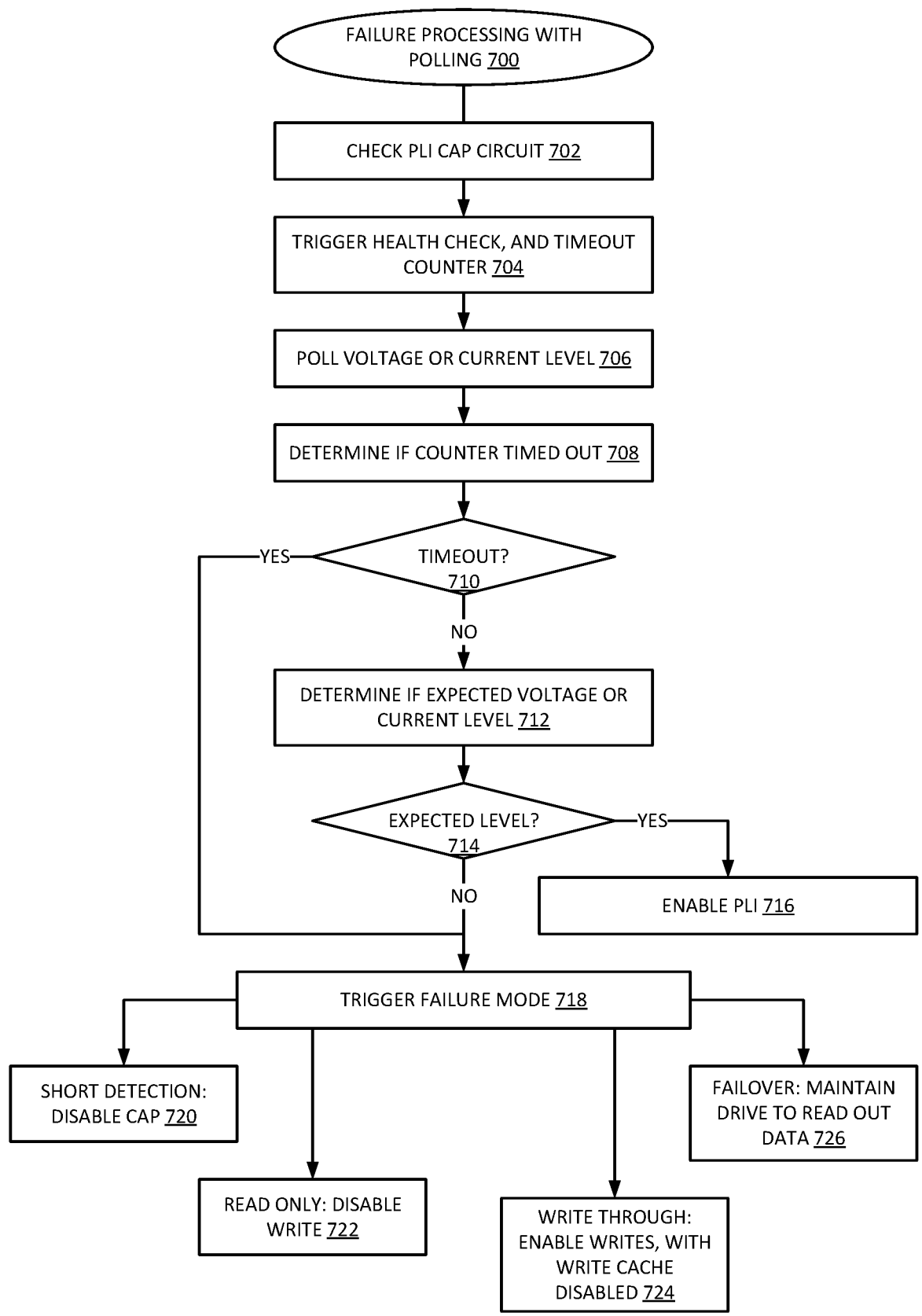
FIG. 7 is a flow diagram of an example of a process for PLI circuit management with polling-based monitoring.

FIG. 7 is a flow diagram of an example of a process for PLI circuit management with polling-based monitoring. Process 700 illustrates a polling-based process for failure processing. The system checks the PLI capacitor circuit, 702. In one example, the system triggers health checking, and can trigger a timeout counter, 704. The health checking can be any one or a combination of voltage checking, current checking, charge time, or discharge time.

The system polls the hardware elements for voltage or current level information, 706. In one example, the system can determine if the counter has timed out, 708. The timer runs out if the capacitor does not achieve an expected voltage or current level within a given time. If the timer runs out, or there is a timeout, 710 YES branch, the system can trigger a failure mode, 718. If there is not a timeout, 710 NO branch, the system can determine if the measured voltage or current level is an expected voltage or current level, 712. The determination can include firmware triggering various computations.

If the measured level is within an expected range, 714 YES branch, the system can enable the PLI, 716. If the measured level is not within the expected range, 714 NO branch, the system triggers a failure mode, 718. In one example, the system disables the PLI capacitor in response to short detection, 720. In one example, the system triggers a nonvolatile memory device to enter a read only mode, disabling the ability to write, 720. In one example, the system triggers a nonvolatile memory device to enter a write through mode, where writes are enabled, but the write cache is disabled, 724. In one example, the system triggers a nonvolatile memory device to enter a failover mode, where the system maintains a nonvolatile drive to read out the data to transfer the contents of a write cache to nonvolatile storage, and can then disable the drive, 726.

It will be understood that the remedial operations are specific to a nonvolatile storage device. In the implementation where the device protected by the PLI capacitor is a device other than a nonvolatile storage device, the remedial actions will be something related to the function of the specific device instead of to the transfer to a nonvolatile storage device.

Figure 8:
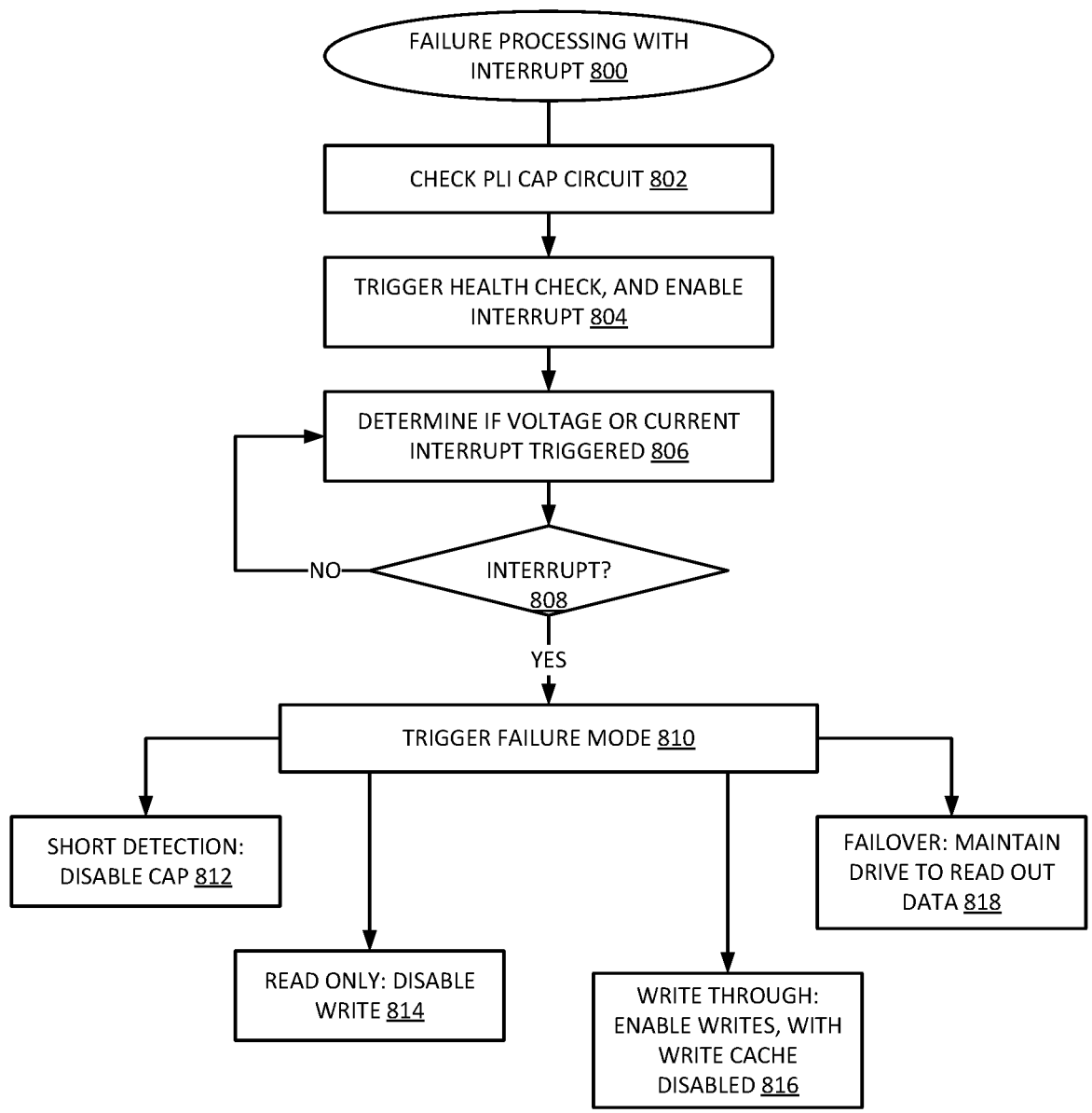
FIG. 8 is a flow diagram of an example of a process for PLI circuit management with interrupt-based monitoring.

FIG. 8 is a flow diagram of an example of a process for PLI circuit management with interrupt-based monitoring. Process 800 illustrates an interrupt-based process for failure processing. The system checks the PLI capacitor circuit, 802. In one example, the system triggers health checking, and can enable an interrupt, 804. The health checking can be any one or a combination of voltage checking, current checking, charge time, or discharge time.

In one example, the system determines if a voltage or current sensor or detector interrupt is triggered, 806. In one example, as long as the interrupt is not triggered, 808 NO branch, the system continues to monitor for the interrupt. The system can operate normally with PLI enabled.

If a voltage or current level goes outside an expected range, the interrupt will trigger. If the interrupt is triggered, 808 YES branch, the system triggers a failure mode, 810. In one example, the system disables the PLI capacitor in response to short detection, 812. In one example, the system triggers a nonvolatile memory device to enter a read only mode, disabling the ability to write, 814. In one example, the system triggers a nonvolatile memory device to enter a write through mode, where writes are enabled, but the write cache is disabled, 816. In one example, the system triggers a nonvolatile memory device to enter a failover mode, where the system maintains a nonvolatile drive to read out the data to transfer the contents of a write cache to nonvolatile storage, and can then disable the drive, 818.

It will be understood that the remedial operations are specific to a nonvolatile storage device. In the implementation where the device protected by the PLI capacitor is a device other than a nonvolatile storage device, the remedial actions will be something related to the function of the specific device instead of to the transfer to a nonvolatile storage device.

Figure 9:
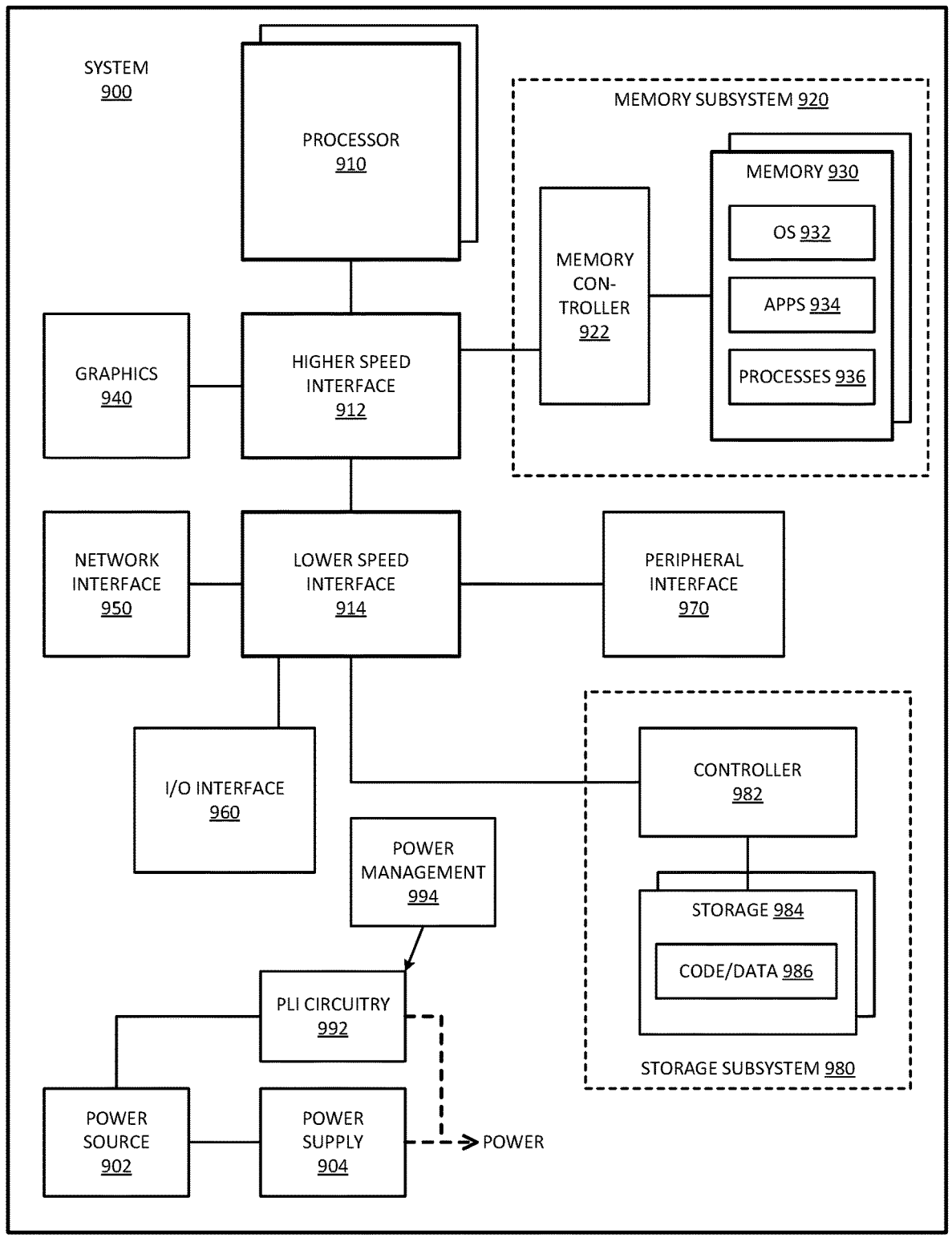
FIG. 9 is a block diagram of an example of a computing system in which PLI circuit management can be implemented.

FIG. 9 is a block diagram of an example of a computing system in which PLI circuit management can be implemented. System 900 represents a computing device in accordance with any example herein, and can be a laptop computer, a desktop computer, a tablet computer, a server, a gaming or entertainment control system, a scanner, copier, printer, routing or switching device, embedded computing device, a smartphone, a wearable device, an internet-of-things device or other electronic device.

In one example, system 900 includes PLI circuitry 992 in parallel with power supply 904. System 900 includes power management 994. In one example, power management 994 and PLI circuitry 992 are included within storage subsystem 980. Power management 994 can be in accordance with any example herein. Power management 994 detects failure of the PLI capacitor of PLI circuitry 992, and can generate an alert if a short is detected. In one example, power management 994 can enable remedial operation when PLI protection is lost.

System 900 includes processor 910, which provides processing, operation management, and execution of instructions for system 900. Processor 910 can include any type of microprocessor, central processing unit (CPU), graphics processing unit (GPU), processing core, or other processing hardware to provide processing for system 900, or a combination of processors. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 900 includes interface 912 coupled to processor 910, which can represent a higher speed interface or a high throughput interface for system components that needs higher bandwidth connections, such as memory subsystem 920 or graphics interface components 940. Interface 912 represents an interface circuit, which can be a standalone component or integrated onto a processor die. Where present, graphics interface 940 interfaces to graphics components for providing a visual display to a user of system 900. In one example, graphics interface 940 can drive a high definition (HD) display that provides an output to a user. High definition can refer to a display having a pixel density of approximately 100 PPI (pixels per inch) or greater, and can include formats such as full HD (e.g., 1080 p), retina displays, 4K (ultra high definition or UHD), or others. In one example, the display can include a touch-screen display. In one example, graphics interface 940 generates a display based on data stored in memory 930 or based on operations executed by processor 910 or both. In one example, graphics interface 940 generates a display based on data stored in memory 930 or based on operations executed by processor 910 or both.

Memory subsystem 920 represents the main memory of system 900, and provides storage for code to be executed by processor 910, or data values to be used in executing a routine. Memory subsystem 920 can include one or more memory devices 930 such as read-only memory (ROM), flash memory, one or more varieties of random access memory (RAM) such as DRAM, or other memory devices, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus.

In one example, system 900 includes interface 914, which can be coupled to interface 912. Interface 914 can be a lower speed interface than interface 912. In one example, interface 914 represents an interface circuit, which can include standalone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can exchange data with a remote device, which can include sending data stored in memory or receiving data to be stored in memory.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, or optical based disks, or a combination. Storage 984 holds code or instructions and data 986 in a persistent state (i.e., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (i.e., the value or state of the data is indeterminate if power is interrupted to system 900). In one example, storage subsystem 980 includes controller 982 to interface with storage 984. In one example controller 982 is a physical part of interface 914 or processor 910, or can include circuits or logic in both processor 910 and interface 914.

Power source 902 provides power to the components of system 900. More specifically, power source 902 typically interfaces to one or multiple power supplies 904 in system 900 to provide power to the components of system 900. In one example, power supply 904 includes an AC to DC (alternating current to direct current) adapter to plug into a wall outlet. Such AC power can be renewable energy (e.g., solar power) power source 902. In one example, power source 902 includes a DC power source, such as an external AC to DC converter. In one example, power source 902 or power supply 904 includes wireless charging hardware to charge via proximity to a charging field. In one example, power source 902 can include an internal battery or fuel cell source.

Figure 10:
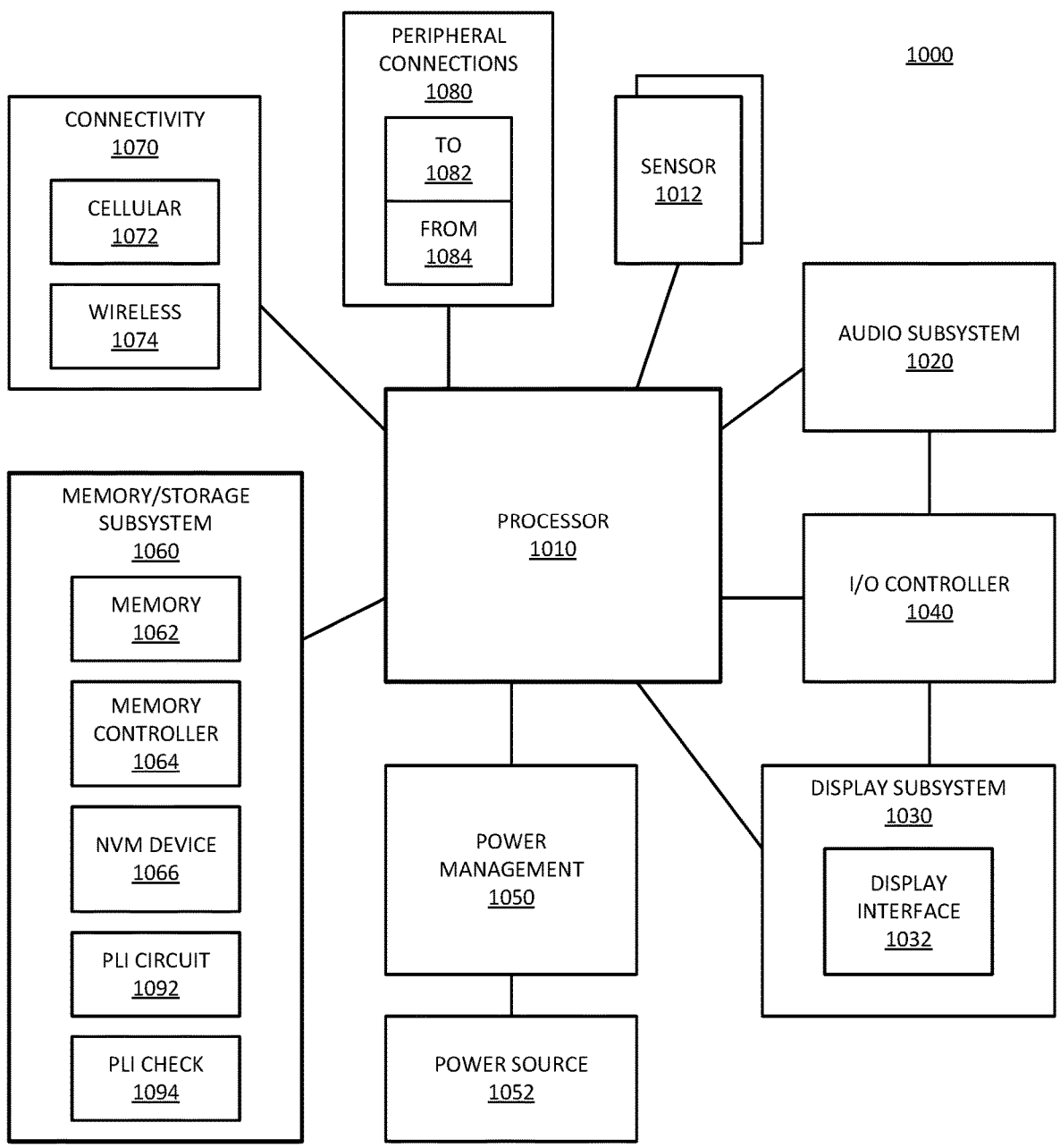
FIG. 10 is a block diagram of an example of a mobile device in which PLI circuit management can be implemented.

FIG. 10 is a block diagram of an example of a mobile device in which PLI circuit management can be implemented. Device 1000 represents a mobile computing device, such as a computing tablet, a mobile phone or smartphone, a wireless-enabled e-reader, wearable computing device, an internet-of-things device or other mobile device, or an embedded computing device. It will be understood that certain of the components are shown generally, and not all components of such a device are shown in device 1000.

In one example, memory/storage subsystem 1060 of device 1000 includes PLI circuit 1092 including a PLI capacitor in parallel with power source 1052. Device 1000 specifically illustrates NVM device 1066, which represents nonvolatile storage for a volatile memory device of memory 1062. In the event of a failure of power source 1052, PLI circuit 1092 can provide energy to enable contents to be transferred from volatile memory to NVM device 1066. Device 1000 includes power management 1050. In one example, power management 1050 includes at least one management component within memory subsystem 1060. In one example, memory/storage subsystem 1060 includes PLI circuit 1092 and PLI check 1094. In one example, power management 1050 includes PLI circuit 1092 and PLI check 1094. PLI check 1094 represents logic within device 1000 to perform PLI circuit monitoring in accordance with any example provided herein. PLI check 1094 detects failure of the PLI capacitor of PLI circuitry 1092, and can generate an alert if a short is detected. In one example, PLI check 1094 can enable remedial operation when PLI protection is lost.

Device 1000 includes processor 1010, which performs the primary processing operations of device 1000. Processor 1010 can include one or more physical devices, such as microprocessors, application processors, microcontrollers, programmable logic devices, or other processing means. The processing operations performed by processor 1010 include the execution of an operating platform or operating system on which applications and device functions are executed. The processing operations include operations related to I/O (input/output) with a human user or with other devices, operations related to power management, operations related to connecting device 1000 to another device, or a combination. The processing operations can also include operations related to audio I/O, display I/O, or other interfacing, or a combination. Processor 1010 can execute data stored in memory. Processor 1010 can write or edit data stored in memory.

In one example, device 1000 includes one or more sensors 1012. Sensors 1012 represent embedded sensors or interfaces to external sensors, or a combination. Sensors 1012 enable device 1000 to monitor or detect one or more conditions of an environment or a device in which device 1000 is implemented. Sensors 1012 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1012 can also include sensors for biometric systems such as fingerprint recognition systems, face detection or recognition systems, or other systems that detect or recognize user features. Sensors 1012 should be understood broadly, and not limiting on the many different types of sensors that could be implemented with device 1000. In one example, one or more sensors 1012 couples to processor 1010 via a frontend circuit integrated with processor 1010. In one example, one or more sensors 1012 couples to processor 1010 via another component of device 1000.

In one example, device 1000 includes audio subsystem 1020, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 1000, or connected to device 1000. In one example, a user interacts with device 1000 by providing audio commands that are received and processed by processor 1010.

Display subsystem 1030 represents hardware (e.g., display devices) and software components (e.g., drivers) that provide a visual display for presentation to a user. In one example, the display includes tactile components or touchscreen elements for a user to interact with the computing device. Display subsystem 1030 includes display interface 1032, which includes the particular screen or hardware device used to provide a display to a user. In one example, display interface 1032 includes logic separate from processor 1010 (such as a graphics processor) to perform at least some processing related to the display. In one example, display subsystem 1030 includes a touchscreen device that provides both output and input to a user. In one example, display subsystem 1030 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one example, display subsystem includes a touchscreen display. In one example, display subsystem 1030 generates display information based on data stored in memory or based on operations executed by processor 1010 or both.

I/O controller 1040 represents hardware devices and software components related to interaction with a user. I/O controller 1040 can operate to manage hardware that is part of audio subsystem 1020, or display subsystem 1030, or both. Additionally, I/O controller 1040 illustrates a connection point for additional devices that connect to device 1000 through which a user might interact with the system. For example, devices that can be attached to device 1000 might include microphone devices, speaker or stereo systems, video systems or other display device, keyboard or keypad devices, or other I/O devices for use with specific applications such as card readers or other devices.

As mentioned above, I/O controller 1040 can interact with audio subsystem 1020 or display subsystem 1030 or both. For example, input through a microphone or other audio device can provide input or commands for one or more applications or functions of device 1000. Additionally, audio output can be provided instead of or in addition to display output. In another example, if display subsystem includes a touchscreen, the display device also acts as an input device, which can be at least partially managed by I/O controller 1040. There can also be additional buttons or switches on device 1000 to provide I/O functions managed by I/O controller 1040.

In one example, I/O controller 1040 manages devices such as accelerometers, cameras, light sensors or other environmental sensors, gyroscopes, global positioning system (GPS), or other hardware that can be included in device 1000, or sensors 1012. The input can be part of direct user interaction, as well as providing environmental input to the system to influence its operations (such as filtering for noise, adjusting displays for brightness detection, applying a flash for a camera, or other features).

In one example, device 1000 includes power management 1050 that manages battery power usage, charging of the battery, and features related to power saving operation. Power management 1050 manages power from power source 1052, which provides power to the components of device 1000. In one example, power source 1052 includes an AC to DC (alternating current to direct current) adapter to plug into a wall outlet. Such AC power can be renewable energy (e.g., solar power, motion based power). In one example, power source 1052 includes only DC power, which can be provided by a DC power source, such as an external AC to DC converter. In one example, power source 1052 includes wireless charging hardware to charge via proximity to a charging field. In one example, power source 1052 can include an internal battery or fuel cell source.

Memory/storage subsystem 1060 includes memory device(s) 1062 for storing information in device 1000. Memory/storage subsystem 1060 can include nonvolatile (state does not change if power to the memory device is interrupted) or volatile (state is indeterminate if power to the memory device is interrupted) memory devices, or a combination. Memory/storage subsystem 1060 can store application data, user data, music, photos, documents, or other data, as well as system data (whether long-term or temporary) related to the execution of the applications and functions of device 1000. In one example, memory/storage subsystem 1060 includes memory controller 1064 (which could also be considered part of the control of device 1000, and could potentially be considered part of processor 1010).

Memory controller 1064 includes a scheduler to generate and issue commands to control access to memory device 1062.

Connectivity 1070 includes hardware devices (e.g., wireless or wired connectors and communication hardware, or a combination of wired and wireless hardware) and software components (e.g., drivers, protocol stacks) to enable device 1000 to communicate with external devices. The external device could be separate devices, such as other computing devices, wireless access points or base stations, as well as peripherals such as headsets, printers, or other devices. In one example, device 1000 exchanges data with an external device for storage in memory or for display on a display device. The exchanged data can include data to be stored in memory, or data already stored in memory, to read, write, or edit data.

Connectivity 1070 can include multiple different types of connectivity. To generalize, device 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1074 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that device 1000 could both be a peripheral device ("to" 1082) to other computing devices, as well as have peripheral devices ("from" 1084) connected to it. Device 1000 commonly has a "docking" connector to connect to other computing devices for purposes such as managing (e.g., downloading, uploading, changing, synchronizing) content on device 1000. Additionally, a docking connector can allow device 1000 to connect to certain peripherals that allow device 1000 to control content output, for example, to audiovisual or other systems.

In addition to a proprietary docking connector or other proprietary connection hardware, device 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example, a circuit for power control includes: a charging circuit to charge a power loss imminent (PLI) capacitor as a backup energy store in case system power is lost; and a path to couple the charging circuit to the PLI capacitor, the path including a series current-limiting circuit, and a diode coupled in parallel with the current-limiting circuit, the diode with a cathode coupled to the charging circuit and an anode to couple to the PLI capacitor.

In one example, the charging circuit comprises a bidirectional converter, wherein the current-limiting circuit is to provide current limitation in boost operation to charge the PLI capacitor, and the diode is to provide a current return path in buck operation to return current from the PLI capacitor to the charging circuit. In one example, the current-limiting circuit comprises a current-limiting resistor. In one example, the diode comprises a hot-carrier diode. In one example, the diode comprises a Zener diode. In one example, the charging circuit comprises a power management system including a controller. In one example, the power management system comprises a power management integrated circuit (PMIC). In one example, the power management system is to detect failure of the PLI capacitor, wherein detection of the failure comprises polling of a pin of the controller. In one example, the power management system is to detect failure of the PLI capacitor, wherein detection of the failure comprises detection of an interrupt on a pin of the controller. In one example, the charging circuit is to detect failure of the PLI capacitor, wherein detection of the failure comprises detection of a low voltage condition or detection of an over-current condition. In one example, the circuit is part of a nonvolatile memory (NVM) device. In one example, the NVM device comprises a solid state drive (SSD). In one example, in response to the detection of failure of the PLI capacitor, the charging circuit is further to limit data access of the NVM device. In one example, limit data access of the NVM device comprises limit data access to the NVM device to read only access. In one example, limit data access of the NVM device comprises limit write access to the NVM device to unbuffered write access. In one example, in response to detection of a failure of the PLI capacitor, the charging circuit is to generate an alert signal to indicate a lack of PLI protection.

In general with respect to the descriptions herein, in one example, an apparatus to store data includes: a nonvolatile storage medium; a power loss imminent (PLI) capacitor as a backup energy store in an event that power is lost to the apparatus; and a power management circuit including a power converter to charge the PLI capacitor, the power converter to couple to the PLI capacitor through a series current-limiter and a diode coupled in parallel with the current-limiter, the diode with a cathode coupled to the power converter and an anode coupled to the PLI capacitor; wherein in response to detection of a failure of the PLI capacitor, the power management circuit is to generate an alert signal.

In one example, the charging circuit comprises a bidirectional converter, wherein the current-limiting circuit is to provide current limitation in boost operation to charge the PLI capacitor, and the diode is to provide a current return path in buck operation to return current from the PLI capacitor to the charging circuit. In one example, the current-limiting circuit comprises a current-limiting resistor. In one example, the diode comprises a hot-carrier diode. In one example, the diode comprises a Zener diode. In one example, the charging circuit comprises a power management system including a controller. In one example, the power management system comprises a power management integrated circuit (PMIC). In one example, the power management system is to detect failure of the PLI capacitor, wherein detection of the failure comprises polling of a pin of the controller. In one example, the power management system is to detect failure of the PLI capacitor, wherein detection of the failure comprises detection of an interrupt on a pin of the controller. In one example, the power management system is to detect failure of the PLI capacitor, wherein detection of the failure comprises detection of a low voltage condition or detection of an over-current condition.

In one example, the apparatus is part of a nonvolatile memory (NVM) device. In one example, the NVM device comprises a solid state drive (SSD). In one example, in response to the detection of failure of the PLI capacitor, the power management system is further to limit data access of the NVM device. In one example, limit data access of the NVM device comprises limit data access to the NVM device to read only access. In one example, limit data access of the NVM device comprises limit write access to the NVM device to unbuffered write access. In one example, in response to detection of a failure of the PLI capacitor, the power management system is to generate an alert signal to indicate a lack of PLI protection. In one example, the apparatus further includes: a host processor device including a multi-core processor; a display communicatively coupled to host processor; a network interface communicatively coupled to host processor; or a battery to power the apparatus.

In general with respect to the descriptions herein, in one example, a method includes: generating power to charge a power loss imminent (PLI) capacitor as a backup energy store in case system power is lost; limiting a current of the power to the PLI capacitor with a series current-limiting circuit in a charging path; and providing a current return path from the PLI capacitor with a diode coupled in parallel with the current-limiting circuit, the diode with a cathode coupled to the charging circuit and an anode to couple to the PLI capacitor.

In one example, the charging circuit comprises a bidirectional converter, wherein the current-limiting circuit is to provide current limitation in boost operation to charge the PLI capacitor, and the diode is to provide a current return path in buck operation to return current from the PLI capacitor to the charging circuit. In one example, the current-limiting circuit comprises a current-limiting resistor. In one example, the diode comprises a hot-carrier diode. In one example, the diode comprises a Zener diode. In one example, generating the power comprises regulating the power with a charging circuit including a power management system having a controller. In one example, the power management system comprises a power management integrated circuit (PMIC). In one example, the power management system is to detect failure of the PLI capacitor, wherein detection of the failure comprises polling of a pin of the controller. In one example, the power management system is to detect failure of the PLI capacitor, wherein detection of the failure comprises detection of an interrupt on a pin of the controller. In one example, the charging circuit is to detect failure of the PLI capacitor, wherein detection of the failure comprises detection of a low voltage condition or detection of an over-current condition. In one example, the PLI capacitor provides backup energy to a nonvolatile memory (NVM) device. In one example, the NVM device comprises a solid state drive (SSD). In one example, in response to detecting a failure of the PLI capacitor, power management system is further to limit data access of the NVM device. In one example, limiting data access of the NVM device comprises limiting data access to the NVM device to read only access. In one example, limiting data access of the NVM device comprises limiting write access to the NVM device to unbuffered write access. In one example, in response to detection of a failure of the PLI capacitor, the power management system is to generate an alert signal to indicate a lack of PLI protection.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A circuit for power control comprising:
a charging circuit including a bidirectional converter to charge a power loss imminent (PLI) capacitor as a backup energy store in case system power is lost; and
an electrical path to couple the charging circuit to the PLI capacitor, the electrical path including a series current-limiting circuit, and a diode coupled in parallel with the current-limiting circuit, the diode with a cathode coupled to the charging circuit and an anode to couple to the PLI capacitor;
wherein the current-limiting circuit is to provide current limitation in boost operation to charge the PLI capacitor, and the diode is to provide a current return path in buck operation to return current from the PLI capacitor to the charging circuit.

2. The circuit of claim 1, wherein the current-limiting circuit comprises a current-limiting resistor.

3. The circuit of claim 1, wherein the diode comprises a hot-carrier diode.

4. The circuit of claim 1, wherein the charging circuit comprises a power management system including a controller.

5. The circuit of claim 4, wherein the power management system comprises a power management integrated circuit (PMIC).

6. The circuit of claim 4, wherein the power management system is to detect failure of the PLI capacitor, wherein detection of the failure comprises polling of a pin of the controller.

7. The circuit of claim 4, wherein the power management system is to detect failure of the PLI capacitor, wherein detection of the failure comprises detection of an interrupt on a pin of the controller.

8. The circuit of claim 1, wherein the charging circuit is to detect failure of the PLI capacitor, wherein detection of the failure comprises detection of a low voltage condition or detection of an over-current condition.

9. The circuit of claim 1, wherein the circuit is part of a nonvolatile memory (NVM) device.

10. The circuit of claim 9, wherein the NVM device comprises a solid state drive (SSD).

11. The circuit of claim 9, wherein in response to the detection of failure of the PLI capacitor, the charging circuit is further to limit data access of the NVM device.

12. The circuit of claim 11, wherein limit data access of the NVM device comprises limit data access to the NVM device to read only access.

13. The circuit of claim 11, wherein limit data access of the NVM device comprises limit write access to the NVM device to unbuffered write access.

14. The circuit of claim 1, wherein in response to detection of a failure of the PLI capacitor, the charging circuit is to generate an alert signal to indicate a lack of PLI protection.

15. An apparatus to store data, comprising:
a nonvolatile storage medium;
a power loss imminent (PLI) capacitor as a backup energy store in an event that power is lost to the apparatus; and
a power management circuit including a bidirectional power converter to charge the PLI capacitor, the power converter to couple to the PLI capacitor through an electrical path including a series current-limiter and a diode coupled in parallel with the current-limiter, the diode with a cathode coupled to the power converter and an anode coupled to the PLI capacitor;
wherein the current-limiter is to provide current limitation in boost operation to charge the PLI capacitor, and the diode is to provide a current return path in buck operation to return current from the PLI capacitor to the bidirectional power converter; and
wherein in response to detection of a failure of the PLI capacitor, the power management circuit is to generate an alert signal.

16. The apparatus of claim 15, wherein the power management circuit comprises a power management integrated circuit (PMIC).

17. The apparatus of claim 15, wherein the power management circuit is to detect failure of the PLI capacitor, wherein detection of the failure comprises detection of a low voltage condition or detection of an over-current condition.

18. The apparatus of claim 15, wherein the power management circuit is to detect failure of the PLI capacitor, wherein in response to the detection of failure of the PLI capacitor, the power management circuit is further to limit data access of the nonvolatile storage medium, including to limit data access to read only access, or to limit write access to unbuffered write access.

19. The apparatus of claim 15, wherein the power management circuit is to generate an alert to management of a host system incorporating the apparatus in response to detection of failure of the PLI capacitor.

20. The apparatus of claim 15, further comprising:
a host processor device including a multi-core processor;
a display communicatively coupled to host processor;
a network interface communicatively coupled to host processor; or
a battery to power the apparatus.

* * * * *